(12) United States Patent
Mulera et al.

(10) Patent No.: US 6,593,758 B2
(45) Date of Patent: Jul. 15, 2003

(54) BUILT-IN TEST SYSTEM FOR AIRCRAFT INDICATION SWITCHES

(75) Inventors: Thomas Mulera, Mesa, AZ (US); Robinson David, Cave Creek, AZ (US)

(73) Assignee: Honeywell International Inc., Morristown, NJ (US)

( * ) Notice: Subject to any disclaimer, the term of this patent is extended or adjusted under 35 U.S.C. 154(b) by 107 days.

(21) Appl. No.: 09/922,204

(22) Filed: Aug. 2, 2001

(65) Prior Publication Data

US 2003/0025515 A1 Feb. 6, 2003

(51) Int. Cl.$^7$ .................. G01R 27/08; G01R 31/02; H01H 31/02; G08B 29/00; H01C 13/02
(52) U.S. Cl. .................. 324/713; 324/415; 324/556; 340/514; 338/215
(58) Field of Search ................. 324/713, 418, 324/421, 422, 415, 556; 340/505, 506, 510, 525, 514; 338/13, 14, 48, 123, 215

(56) References Cited

U.S. PATENT DOCUMENTS

| | | | |
|---|---|---|---|
| 3,550,090 A | 12/1970 | Baker, Jr. et al. | |
| 3,821,733 A | 6/1974 | Reiss et al. | |
| 4,027,286 A | 5/1977 | Marosko | |
| 4,359,721 A | 11/1982 | Galvin et al. | |
| 4,423,410 A | * 12/1983 | Galvin et al. | 340/525 |
| 4,437,783 A | 3/1984 | Halin et al. | |
| 4,441,100 A | 4/1984 | Galloway | |
| 4,491,828 A | * 1/1985 | Galvin et al. | 340/525 |
| 4,651,138 A | * 3/1987 | Morrison | 340/510 |
| 5,161,158 A | 11/1992 | Chakravarty et al. | |
| 5,167,119 A | 12/1992 | Ward | |
| 5,508,626 A | * 4/1996 | Halin et al. | 324/713 |
| 5,720,449 A | 2/1998 | Laboure et al. | |

* cited by examiner

Primary Examiner—Anjan K. Deb
(74) Attorney, Agent, or Firm—Robert Desmond, Esq.

(57) ABSTRACT

A built-in test system for aircraft indication switches comprises a plurality of aircraft indication switches and a first resistor adding network having input resistors individually connected to first contacts of different ones of the indication switches. The test system further includes a second resistor adding network having input resistors individually connected to second contacts of different ones of the indication switches. Output circuitry is provided for coupling outputs of the first and second resistor adding networks to an electronic control unit for the aircraft.

23 Claims, 1 Drawing Sheet

BUILT-IN TEST SYSTEM FOR AIRCRAFT INDICATION SWITCHES

BACKGROUND OF THE INVENTION

This invention relates to test systems for aircraft indication switches and is particularly useful in connection with thrust reverser indication switches on turbojet powered aircraft.

Most present day turbojet aircraft employ thrust reverser mechanisms for reversing the direction of jet flow from the engines for purposes of braking the forward movement of the aircraft. Inadvertent deployment of the thrust reversers during normal flight can adversely affect the performance of the aircraft, even to the point of losing control of the aircraft. For these reasons, various indication switches are associated with different parts of the thrust reverser mechanisms for monitoring their status and warning of undesired conditions. Unfortunately, one or more of the indication switches may themselves become defective and cause an alarm that may be falsely identified as a system failure. It would be desirable, therefore, to be able to identify the occurrence of a switch failure as a switch failure and not a thrust reverser or other system failure and to identify the particular switch that failed. This would enable appropriate corrective action to be taken with a minimum negative impact to thrust reverser or other system availability.

For the foregoing reasons, there is a need for a device capable of detecting and identifying that the occurrence of a thrust reverser or other system switch failure is not indicative of an actual thrust reverser or other system failure.

SUMMARY OF THE INVENTION

One aspect of the present invention provides a built-in test system for aircraft indication switches for identifying the occurrence of a switch failure and the identity of the particular switch that failed. The test system comprises a plurality of aircraft indication switches for providing information on various aircraft functions. The test system further includes a first resistor adding network having input resistors individually connected to first contacts of different ones of the indication switches. The test system also includes a second resistor adding network having input resistors individually connected to second contacts of different ones of the indication switches. The test system additionally includes circuitry for individually coupling the outputs of the first and second resistor adding networks to an electronic control unit for the aircraft.

In another aspect of the invention, there is provided a method of testing aircraft indication switches. This method includes the step of monitoring first contacts of a group of aircraft indication switches for obtaining first indications of switch status. This method also includes the step of monitoring second contacts of the same group of aircraft indication switches for obtaining second indications of switch status. The method further includes the step of comparing the first and second indications for determining the occurrence of a switch failure.

For a better understanding of the present invention, together with other and further advantages and features thereof, reference is made to the following description taken in connection with the accompanying drawing, the scope of the invention being pointed out in the appended claims.

DETAILED DESCRIPTION OF THE INVENTION

Figure 1:
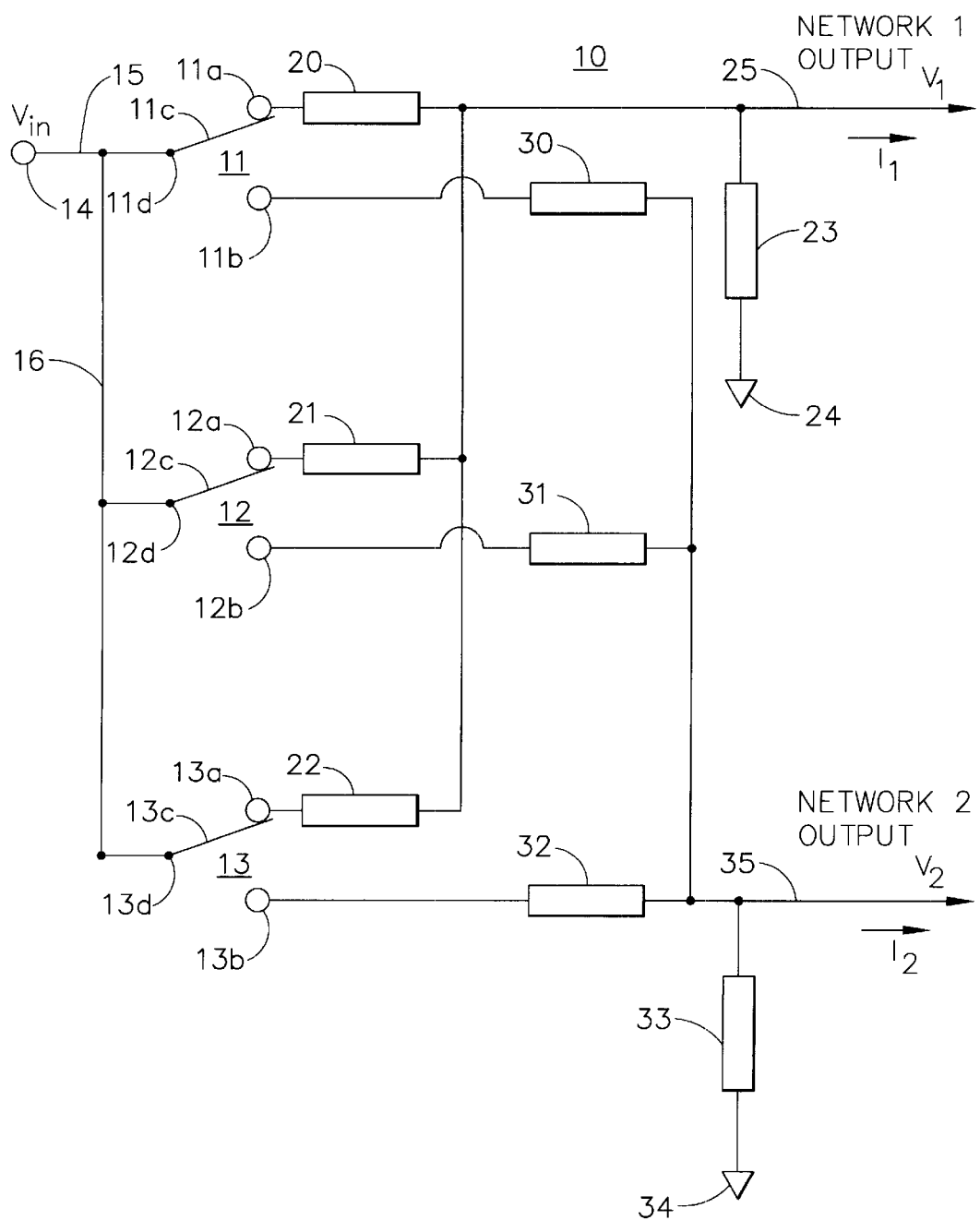
FIG. 1 is a schematic circuit diagram of a representative embodiment of a built-in test system constructed in accordance with the present invention.

Referring to FIG. 1, there is shown a built-in test system 10 for aircraft indication switches. System 10 includes a plurality of indication switches 11, 12 and 13, each switch having first and second contacts and an arm member connected to a switch terminal and movable back and forth for contacting one or the other of the first and second contacts. In particular, indication switch 11 has first and second contacts 11a and 11b, and an arm member 11c connected to a switch terminal 11d. Arm member 11c is movable back and forth for contacting one or the other of the first and second contacts 11a and 11b. Indication switch 12 has first and second contacts 12a and 12b and an arm member 12c connected to a switch terminal 12d. The third Indication switch 13 has first and second contacts 13a and 13b and an arm member 13c connected to a switch terminal 13d, arm member 13c being movable between contacts 13a and 13b.

Circuitry is provided for supplying a direct-current source voltage $V_{in}$ to the arm member terminals 11d, 12d and 13d of indication switches 11, 12 and 13. This circuitry includes a voltage input terminal 14 and conductors 15 and 16. Thus, the same value of source voltage is supplied to each of the arm members 11c, 12c and 13c.

The built-in test system 10 further includes a first resistor adding network having a plurality of input resistors 20, 21 and 22 individually connected to first contacts 11a, 12a and 13a, respectively, of different ones of the indication switches 11, 12 and 13. This first adding network also includes a single output resistor or load resistor 23 connected to the second ends of input resistors 20, 21 and 22. The other end of output resistor 23 is connected to a circuit ground point 24.

Test system 10 also includes a second resistor adding network having a plurality of input resistors 30, 31 and 32 and a single output or load resistor 33. Input resistors 30, 31 and 32 have first ends individually connected to different ones of the second contacts 11b, 12b and 13b of switches 11, 12 and 13. The second ends of input resistors 30, 31 and 32 are connected to the output resistor 33. The other end of output resistor 33 is connected to a circuit ground point 34.

The test system 10 further includes output circuitry for coupling the outputs of the first and second resistor adding networks to different input terminals of an electronic control unit (not shown) for the aircraft. This output circuitry includes a first output conductor 25 for connecting the upper end of the first network output resistor 23 to a first input terminal of the electronic control unit. This output circuitry further includes a second output conductor 35 for connecting the upper end of the second network output resistor 33 to a second input terminal of the electronic control unit.

The resistances of the input resistors 20, 21 and 22 in the first adding network are of different values. Such values are selected to provide output indications across the first network output resistor 23 that indicates which first contacts 11a, 12a and 13a are being contacted by arm members 11c, 12c and 13c. A usable set of values is obtained by selecting the values of resistors 20–23 such that the voltage components produced across output resistor 23 by the different switches bear a 1-2-4 relationship to one another. In other words, if only the first arm member 11c is in contact with its first contact 11a, then one unit of voltage is produced across output resistor 23. If only the second arm member 12c is in contact with its first contact 12a, then two units of voltage are produced across output resistor 23. And if only the third arm member 13c is in contact with its first contact 13a, then four units of voltage are produced across output resistor 23. If all three arm members are contacting their first contacts, then the output voltage is a maximum, having a relative value of seven units. If none of the three arm members are contacting their first contacts, then the output voltage is zero. Different combinations of arm members contacting first contacts will produce intermediate values of output voltage. Thus, by sensing the value of the output voltage $V_1$ across output resistor 23, the electronic control unit knows which arm members 11c, 12c and 13c are in contact with their first contacts 11a, 12a and 13a.

Similar considerations apply to the second adding network provided by resistors 30–33. The resistance values of input resistors 30–32 in the second network are different and are selected to provide output indications across the second network output resistor 33 which indicate which second contacts 11b, 12b and 13b are being contacted by arm members 11c, 12c and 13c. A usable set of values is obtained by selecting the values of resistors 30–33 such that the voltage components produced across output resistor 33 by the different switches bear a 1-2-4 relationship to one another. Thus, by sensing the value of the output voltage $V_2$ across output resistor 33, the electronic control unit knows which arm members 11c, 12c and 13c are in contact with their second contacts 11b, 12b and 13b.

Among other things, the present invention is useful in connection with thrust reverser indication switches on turbojet powered aircraft. For example, the first switch 11 may be a thrust reverser deployment indication switch having its arm member 11c linked to the thrust reverser deployment mechanism such that arm member 11c contacts first contact 11a when the thrust reverser is not deployed and contacts second contact 11b when the thrust reverser is deployed. The second switch 12 may be, for example, a thrust reverser stowed indication switch having its arm member 12c linked to the thrust reverser stowage mechanism such that arm member 12c contacts first contact 12a when the thrust reverser is stowed and contacts second contact 12b when the thrust reverser is not stowed. The third switch 13 may be, for example, a thrust reverser latched indication switch having its arm member 13c linked to the thrust reverser latching mechanism such that arm member 13c contacts first contact 13a when the latching mechanism is latched and contacts second contact 13b when the latching mechanism is not latched.

In the "rest" or normal thrust reverser stowed state, all arm members 11c, 12c and 13c are contacting their first contacts 11a, 12a and 13a. In this condition, the first resistor network 20–23 is active and the second resistor network 30–33 is passive. The voltage or current (resistance) measured at the first network output by the electronic control unit is based on the parallel equivalent resistance of all input resistors 20–22 for the first network, while there is no signal at the output of the second resistor network 30–33. In the "operating" or thrust reverser deployed state, just the opposite is true. The second network 30–33 generates an output as a function of the parallel equivalent resistance of all its input resistors 30–32, while there is no signal at the output of the first network 20–23.

When one of the switches changes state, the electronic control unit detects a change in the first network output and "knows" which switch has changed. Based on other information available to the electronic control unit, such as thrust reverser system commands, engine power setting, and other aircraft inputs, it can be established whether or not this change of switch position was intended, or not intended, to occur. Establishing "intent" would indicate normal commanded thrust reverser operation. Establishing "non-intent" would indicate system failure or inadvertent thrust reverser operation. The simultaneous change of state of both the first network leg and the second network leg for a particular switch establishes a verification of the operation of that particular switch. If a change of state does not occur in both networks, a potential switch failure or circuit failure is identified. Thus, a switch failure or circuit failure (such as a broken wire) which would typically be falsely identified as a thrust reverser system failure is correctly identified and corrective action can be taken with a minimum of impact on aircraft operation.

It is to be noted that the present invention is not limited to use with thrust reverser indication switches. It may also be used with other aircraft indication switches such as, for example, indication switches associated with the landing gear systems.

It is to be further noted that the built-in test system of the present invention may be applied to situations involving more than three indication switches. If additional switches are involved, then a like number of additional input resistors are added to each of the two resistor adding networks.

While there has been described what are at present considered to be preferred embodiments of this invention, it will be obvious to those skilled in the art that various changes and modifications may be made therein without departing from the invention and it is, therefore, intended to cover all such changes and modifications as come within the true spirit and scope of the invention.

We claim:

1. A built-in test system for aircraft indication switches, such system comprising:
   a plurality of aircraft indication switches;
   a first resistor adding network having input resistors individually connected to first contacts of different ones of the indication switches;
   a second resistor adding network having input resistors individually connected to second contacts of different ones of the indication switches; and
   circuitry for coupling outputs of the first and second resistor adding networks to an electronic control unit for the aircraft;
   wherein the output voltage of the first resistor adding network is zero when all indication switches are connected to the second contacts and the output voltage of the second resistor adding network is zero when all indication switches are connected to the first contacts.

2. A built-in test system in accordance with claim 1 further including circuitry for supplying a source voltage to arm members of the indication switches.

3. A built-in test system in accordance with claim 2 wherein the same value of source voltage is supplied to each of the arm members of the different indication switches.

4. A built-in test system in accordance with claim 1 wherein the resistances of the input resistors in each network are of different values, such values being selected to provide output indications of which indication switch contacts are being contacted by indication switch arm members.

5. A built-in test system in accordance with claim 1 wherein the first resistor adding network is comprised of a plurality of input resistors and a single output resistor, each input resistor having a first end connected to an indication switch contact and a second end connected to the output resistor.

6. A built-in test system in accordance with claim 5 wherein the resistances of the input resistors are of different values, such values being selected to provide output indications of which indication switch contacts are being contacted by indication switch arm members.

7. A built-in test system in accordance with claim 1 wherein the second resistor adding network is comprised of a plurality of input resistors and a single output resistor, each input resistor having a first end connected to an indication switch contact and a second end connected to the output resistor.

8. A built-in test system in accordance with claim 7 wherein the resistances of the input resistors are of different values, such values being selected to provide output indications of which indication switch contacts are being contacted by indication switch arm members.

9. A built-in test system in accordance with claim 1 wherein:
   the first resistor adding network is comprised of a plurality of input resistors and a single output resistor, each input resistor having a first end connected to an indication switch contact and a second end connected to the output resistor; and
   the second resistor adding network is comprised of a plurality of input resistors and a single output resistor, each input resistor having a first end connected to an indication switch contact and a second end connected to the output resistor.

10. A built-in test system in accordance with claim 9 wherein the resistances of the input resistors in each network are of different values, such values being selected to provide network output indications of which indication switch contacts are being contacted by indication switch arm members.

11. A built-in test system in accordance with claim 10 wherein the resistance values of each input resistor of a selected network are different binary multiples of the input resistor having the least resistance, wherein the value of the resistor having the least resistance is N and the value of each remaining resistor is N times the quantity 2 to the i-th power, where i is an sequential integer assigned to each remaining resistor starting with the integer 1 for the second resistor.

12. A method of testing aircraft indication switches in a built-in test system according to the apparatus described in claim 1, such method comprising the steps of:
   monitoring first contacts of a group of aircraft indication switches for obtaining first indications of switch status;
   monitoring second contacts of the same group of aircraft indication switches for obtaining second indications of switch status; and
   comparing the first and second indications for determining the occurrence of a switch failure.

13. The method of claim 12 including a step of energizing the arm members of the aircraft indication switches.

14. The method of claim 12 wherein a first resistor adding network is used for monitoring the first contacts of the aircraft indication switches.

15. The method of claim 12 wherein a second resistor adding network is used for monitoring the second contacts of the aircraft indication switches.

16. The method of claim 12 wherein a first resistor adding network is used for monitoring the first contacts and a second resistor adding network is used for monitoring the second contacts of the aircraft indication switches.

17. The method of claim 12 wherein the first and second indications are supplied to an aircraft electronic control unit.

18. A built-in indication switch test system comprising:
   a plurality of indication switches each having first and second contacts and an arm member connected to a switch terminal and movable back and forth for contacting one or the other of the first and second contacts;
   circuitry for supplying a source voltage to the arm member terminal of each of the indication switches;
   a first plurality of resistors individually having a first end connected to different ones of the first contacts of the indication switches and a second end connected to a common first load resistor, wherein the output voltage across the first load resistor is zero when the arm members of all switches are connected to their respective second contacts;
   a second plurality of resistors individually having a first end connected to different ones of the second contacts of the indication switches and a second end connected to a common second load resistor, wherein the output voltage across the second load resistor is zero when the arm members of all switches are connected to their respective first contacts; and
   circuitry for connecting the first and second load resistors to different input terminals of an electronic control unit.

19. A built-in test system in accordance with claim 18 wherein:
   the resistances of the resistors in the first plurality of resistors are of different values, such values being selected to provide output indications across the first load resistor which indicate which first contacts are being contacted by indication switch arm members; and
   the resistances of the resistors in the second plurality of resistors are of different values, such values being selected to provide output indications across the second load resistor which indicate which second contacts are being contacted by indication switch arm members.

20. A built-in test system in accordance with claim 19 wherein the resistances of each of the input resistors in a selected plurality of resistors are different binary multiples of the input resistor having the least resistance, wherein the value of the resistor having the least resistance is N and the value of each remaining resistor is N times the quantity 2 to the i-th power, where i is an integer assigned to each remaining resistor starting with the integer 1 for the second resistor.

21. A built-in test system for aircraft thrust reverser indication switches, such system comprising:
   a thrust reverser deployed indication switch having first and second contacts and an arm member connected to a switch terminal and movable for contacting the first contact when the thrust reverser is not deployed and for contacting the second contact when the thrust reverser is deployed;
   a thrust reverser stowed indication switch having first and second contacts and an arm member connected to a switch terminal and movable for contacting the first contact when the thrust reverser is stowed and for contacting the second contact when the thrust reverser is not stowed;
   a thrust reverser latched indication switch having first and second contacts and an arm member connected to a switch terminal and movable for contacting the first contact when the thrust reverser is latched and for contacting the second contact when the thrust reverser is not latched;
   circuitry for supplying a source voltage to the arm member switch terminal of each of the indication switches;
   a first plurality of resistors individually having a first end connected to different ones of the first contacts of the indication switches and a second end connected to a common first load resistor, wherein the output voltage across the first load resistor is zero when the arm members of all switches are connected to their respective second contacts;

a second plurality of resistors individually having a first end connected to different ones of the second contacts of the indication switches and a second end connected to a common second load resistor, wherein the output voltage across the second load resistor is zero when the arm members of all switches are connected to their respective first contacts;

circuitry for connecting the first and second load resistors to different input terminals of an aircraft electronic control unit.

22. A built-in test system in accordance with claim 21 wherein the resistances of the input resistors in a selected plurality of resistors bear a 1-2-4 relationship to one another.

23. A built-in indication switch test system comprising:

a plurality of indication switches each having first and second contacts and an arm member connected to a switch terminal and movable back and forth for contacting one or the other of the first and second contacts;

circuitry for supplying a source voltage to the arm member terminal of each of the indication switches;

a first plurality of resistors individually having a first end connected to different ones of the first contacts of the indication switches and a second end connected to a common first load resistor, wherein the output voltage across the first load resistor is zero when the arm members of all switches are connected to their respective second contacts, and the resistance of a selected resistor in the first plurality of resistors is assigned the value of N, with the value of each remaining resistor in the first plurality of resistors being assigned the value N times the quantity 2 to the i-th power, where i is an unique integer assigned to each remaining resistor in the first plurality of resistors;

a second plurality of resistors individually having a first end connected to different ones of the second contacts of the indication switches and a second end connected to a common second load resistor, wherein the output voltage across the second load resistor is zero when the arm members of all switches are connected to their respective first contacts, and the resistance of a selected resistor in the second plurality of resistors is assigned the value of N, with the value of each remaining resistor in the second plurality of resistors being assigned the value N times the quantity 2 to the i-th power, where i is an unique integer assigned to each remaining resistor in the second plurality of resistors; and circuitry for connecting the first and second load resistors to different input terminals of an electronic control unit.

* * * * *

UNITED STATES PATENT AND TRADEMARK OFFICE
CERTIFICATE OF CORRECTION

PATENT NO. : 6,593,758 B2
DATED : July 15, 2003
INVENTOR(S) : Thomas Mulera and David Robinson It is certified that error appears in the above-identified patent and that said Letters Patent is hereby corrected as shown below:

<u>Title page,</u>
Item [75], replace "Robinson David" with -- David Robinson --

Signed and Sealed this

Eighteenth Day of November, 2003

JAMES E. ROGAN
*Director of the United States Patent and Trademark Office*